(12) United States Patent
Deng

(10) Patent No.: US 7,901,144 B2
(45) Date of Patent: Mar. 8, 2011

(54) OPTICAL INTERCONNECT SOLUTION

(75) Inventor: Hongyu Deng, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/049,062

(22) Filed: Mar. 14, 2008

(65) Prior Publication Data

US 2009/0232514 A1   Sep. 17, 2009

(51) Int. Cl.
*G02B 6/42* (2006.01)
(52) U.S. Cl. .......................................... 385/88; 385/89
(58) Field of Classification Search .................. None
See application file for complete search history.

(56) References Cited

U.S. PATENT DOCUMENTS

| | | | |
|---|---|---|---|
| 4,311,359 A * | 1/1982 | Keller | 385/88 |
| 4,327,964 A | 5/1982 | Haesly et al. | |
| 4,406,515 A | 9/1983 | Roberts | |
| 4,427,879 A * | 1/1984 | Becher et al. | 250/215 |
| 4,461,537 A * | 7/1984 | Raymer et al. | 385/88 |
| 4,533,209 A * | 8/1985 | Segerson et al. | 385/88 |
| 5,076,656 A | 12/1991 | Briggs et al. | |
| 5,127,075 A * | 6/1992 | Althaus et al. | 385/94 |
| 5,259,052 A | 11/1993 | Briggs et al. | |
| 5,757,997 A | 5/1998 | Birrell et al. | |
| 6,018,606 A * | 1/2000 | Sogabe et al. | 385/136 |
| 6,074,102 A * | 6/2000 | Oikawa | 385/88 |
| 6,086,263 A * | 7/2000 | Selli et al. | 385/88 |
| 7,025,619 B2 | 4/2006 | Tsui et al. | |
| 7,413,355 B2 * | 8/2008 | Nishizawa et al. | 385/93 |
| 2002/0012505 A1 * | 1/2002 | Naito | 385/88 |
| 2003/0174968 A1 * | 9/2003 | Kang et al. | 385/52 |
| 2004/0248468 A1 | 12/2004 | Gurovich et al. | |
| 2005/0008302 A1 * | 1/2005 | Miyamae | 385/88 |
| 2005/0067698 A1 * | 3/2005 | Aruga et al. | 257/737 |
| 2005/0117913 A1 * | 6/2005 | Hung et al. | 398/139 |
| 2005/0195865 A1 * | 9/2005 | Aronson | 372/9 |
| 2005/0286901 A1 * | 12/2005 | Sasser et al. | 398/135 |
| 2006/0153503 A1 | 7/2006 | Suzuki et al. | |
| 2006/0171631 A1 * | 8/2006 | Deng et al. | 385/28 |
| 2007/0098335 A1 * | 5/2007 | Baek et al. | 385/93 |

(Continued)

FOREIGN PATENT DOCUMENTS

JP      1-229209 A   *   9/1989

(Continued)

OTHER PUBLICATIONS

SFF-8431 Specifications for Enhanced 8.5 and 10 Gigabit Small Form Factor Pluggable Module "SFP+", Revision 2.0, Apr. 26, 2007, p. 1. Retrieved from http://www.mergeoptics.com/pdf/SFF-8431.pdf.*

(Continued)

*Primary Examiner* — Mike Stahl
(74) *Attorney, Agent, or Firm* — Wyatt, Tarrant & Combs, LLP; William S. Parks

(57) ABSTRACT

A low-cost, high-speed optical interconnect replacement for current electrical interconnects on printed circuit boards is provided. The invention achieves its goal by including an optical transmitter module or optical receiver module mounted in close proximity to a modulator used to encode optical signals from electrical impulses or decode optical signals to electrical impulses. A bare optical fiber is then used to transmit the signal from an optical encoding source to an optical receiver, providing a high-speed method of replacement for traditional electrical interconnects.

2 Claims, 1 Drawing Sheet

U.S. PATENT DOCUMENTS

2008/0050074 A1 * 2/2008 Dallesasse et al. ............. 385/92

FOREIGN PATENT DOCUMENTS

JP 7-140359 A * 6/1995

OTHER PUBLICATIONS

SFP+: Advantages and Challenges in designing-in SFP+. Retrieved from http://www.opnext.com/products/pdf/SFP+_AdvantagesAndChallenges.pdf on Aug. 22, 2008.*

U.S. Appl. No. 12/049,082 Office Action dated Nov. 16, 2009.
U.S. Appl. No. 12/049,082 Office Action dated Aug. 26, 2009.
U.S. Appl. No. 12/049,082 Office Action dated Jun. 10, 2009.
U.S. Appl. No. 12/049,082 Office Action dated Feb. 5, 2009.
U.S. Appl. No. 12/049,082 Office Action dated Aug. 28, 2008.
U.S. Appl. No. 12/049,123 Office Action dated Nov. 27, 2009.
Notice of Allowance and Issue Fee Due dated Jun. 25, 2010, U.S. Appl. No. 12/049,082.
Final Office Action dated Aug. 4, 2010, U.S. Appl. No. 12/049,123.

* cited by examiner

OPTICAL INTERCONNECT SOLUTION

FIELD OF THE INVENTION

The present invention relates to a method for optical interconnection of electrical components in order to transmit data at a faster and more efficient rate of speed. The invention achieves its goal by including an optical transmitter module or optical receiver module mounted in close proximity to a modulator used to encode optical signals from electrical impulses or decode optical signals to electrical impulses. An optical fiber is then used to transmit the signal from an optical encoding source to an optical receiver, providing a high-speed method of replacement for traditional electrical interconnects.

BACKGROUND OF THE INVENTION

As future high speed computing technologies find a need to transfer large amounts of data from point to point within an electronic component, technologies will have to adapt in order to satisfy this requirement. The common solution today is to carry inter-circuit and intra-circuit signals via traditional electrical conductors. As processing speeds increase, however, the skin effect of high frequency electrical signals can create a host of problems including high resistance, large power consumption, and a limited signal transmission distance.

In recent years, increased attention has been focused on optical interconnects as a means to solve the problems encountered with traditional electrical connections. While optical connections have always been known for their speed and reliability they have also been associated with a high cost of implementation. In fact, in an effort to help advance the relevant Art in the field, intense research has been underway in the field of silicon photonics which uses silicon as a substrate to generate, modulate, and transmit optical signals using low cost and easily produced components.

ADVANTAGES AND SUMMARY OF THE INVENTION

One advantage of the present invention is it permits high speed connections through a single (bare) fiber at a very low cost and very reliable microdevice. Another advantage of the invention is the capability of the connector in preventing connection failure due to improper seating of an optical fiber while simultaneously exhibiting a small footprint for easy incorporation into most PCB applications.

Accordingly, the present invention encompasses an optical connection between printed circuit boards, said connection being microsized so as to permit a single optical fiber to transfer optical signals converted from electrical impulses between said printed circuit boards. Furthermore, encompassed as well within the invention is such a micro-connection between printed circuit boards exhibiting a transfer rate of at least 10 Gb/s.

The present invention represents a significant improvement between the speed required for large memory-size transmissions and communications and the cost necessary to produce the information transfer component. Current electrical interconnects on printed circuit boards ("PCBs") rely on electrical impulses to carry communication signals. As the speed of communication increases, however, the high frequency of the signals being transmitted via these electrical conductors increases as well and the skin effect principle begins to limit and degrade the ability to effectively transmit these signals. The skin effect effectively increases the resistance of the conductor to a point of limiting the communication possible via a particular pathway. As a solution, traditional electrical interconnects may be replaced with current optical technology but this solution is prohibitively expensive and impractical using current technology.

In order to solve the limitations in high speed communications, the current invention describes a low-cost optical interconnect solution. As a part of that solution, the current invention provides for the use of optical micro-connectors to couple bare optical fiber as a means of providing a communication pathway. An optical transmitter located on a PCB utilizes silicon circuitry to convert electrical impulses to optical signals. This signal is subsequently transmitted via the attached optical fiber to an end point where a receiving module converts the optical signal back to electrical impulses for transmission to related components on the PCB. The optical transmission of the signal eliminates the skin effect found in electrical transmissions and provides a much higher capacity link between components.

The above-described advantages are achieved by mounting an optical transmitter module and an optical receiver module directly onto a PCB with silicon circuitry near or underneath the module. These transmitting and receiving modules execute spatial optical transmission and reception of signals converted to and from electrical impulses by the silicon circuitry to which they are attached. Optical signals are transmitted between the optical transmitting module and the optical receiving module via an optical fiber held in position by an appropriate micro-connector.

More specifically, in one potentially preferred embodiment of the optical interconnection system, there is provided an optical connector for connecting electronic components co-located on the same PCB or on separate PCBs and having a first connector and second connector for transmitting and receiving information between such components. The first connector includes at least an optical transmitter that converts electric signal input to an optical signal output and transmits said data via an optical fiber to a second connector. The second connector includes at least one optical receiver module that converts optical signal input transmitted via an optical fiber from the optical transmitter module of the first connector and outputs an electrical signal output to be used by components on the PCB.

In a second potentially preferred embodiment, there is provided a method for connecting electronic components co-located on the same PCB or on separate PCBs and having a first connector and second connector for transmitting information between such components. The first connector includes at least an optical transmitter that converts an electric signal input to an optical signal output and transmits said data via an optical fiber to a second connector. The second connector includes at least one optical receiver module that converts an optical signal input which is received via the optical fiber from the optical transmitter module of the first connector and outputs an electrical signal output to be used by components on the PCB. The second connector may also include at least one optical transmitter to convert electrical signal input to an optical signal output and transmit the output via the same optical fiber back to the first connector which then includes at least one optical receiver module that converts optical signal input from the optical transmitter module of the second connector and outputs an electrical signal to be used by components on the PCB.

Consequently, the second potentially preferred embodiment enables bi-directional optical transmitting to be executed so as to achieve diversification of information transmitting because the optical transmitter module and optical receiver modules are disposed on both the first and second connectors.

In a third potentially preferred embodiment, there is provided an optical connector according to the prior embodiments, wherein the wavelengths of optical signals transmitted by the optical transmitter modules of the first connector and the second connector are different from each other and the optical receiver module corresponding to the optical transmitter module includes a wavelength selecting filter that allows only the wavelength of the optical signal transmitted by the corresponding optical transmitter module to pass through to the corresponding receiver module.

Because the wavelengths of optical signals emitted from the optical transmitter modules are set different from each other and the optical receiver modules include a wavelength selecting filter, the present invention enables the optical receiver module to receive an optical signal from the corresponding optical transmitter module securely, thereby achieving stable optical transmission.

In a fourth potentially preferred embodiment, there is provided the optical connector according to any one of the prior embodiments, wherein a lens assembly fabricated from glass, plastic or other suitable material; is capable of being coupled to the connector and is aligned between the optical transmitting module and an optical fiber and is used for focusing and directing the optical signal on an optical fiber.

BRIEF DESCRIPTION OF THE DRAWINGS

To further clarify the above and other advantages and features of the present invention, a more particular description of the invention will be rendered by reference to example embodiments thereof which are illustrated in the appended drawings. These drawings depict only example embodiments of the invention and are not to be considered limiting in their scope. A brief description of each drawing is included below.

DETAILED DESCRIPTION OF THE INVENTION AND PREFERRED EMBODIMENTS

Detailed embodiments of the present invention are disclosed herein; however, as will be readily apparent to those skilled in the art, the present invention may be produced in other specific forms without departing from its spirit or essential characteristics. The present embodiments, are therefore, to be considered as illustrative and not restrictive, the scope of the invention being indicated by the claims rather than the following description, and all changes which come within the meaning and range of the equivalence of the claims are therefore intended to be embraced therein.

Figure 1:
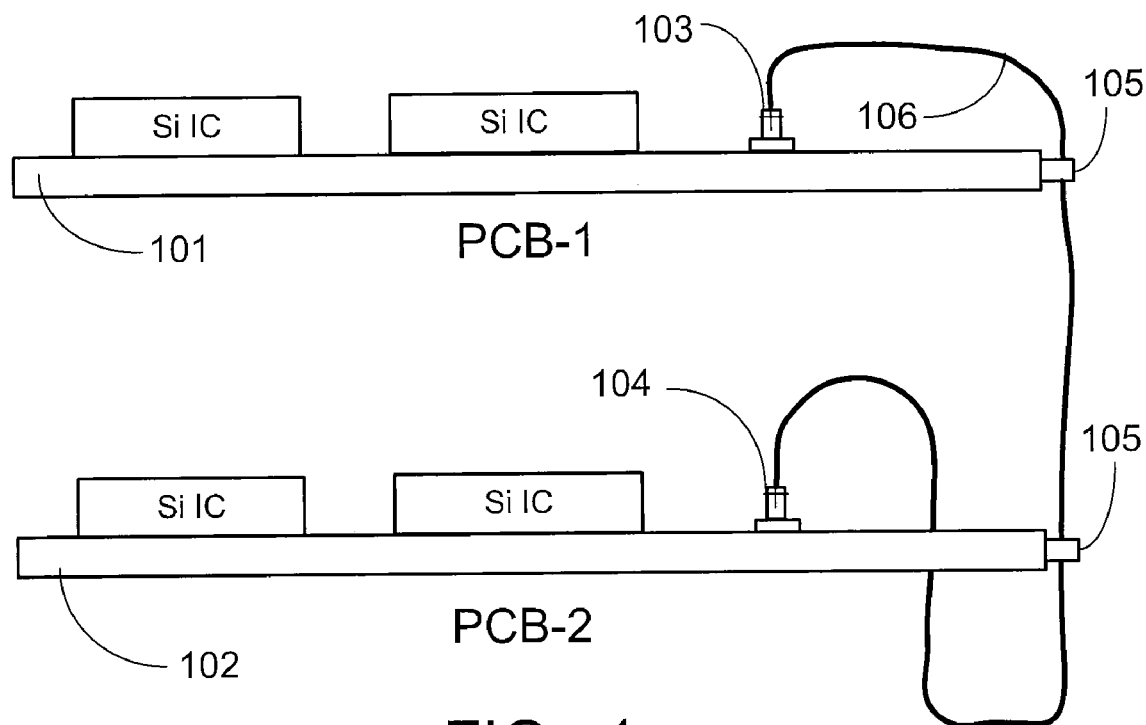
FIG. 1 is a schematic drawing showing the placement of micro-connectors on two separate PCBs performing one-way communication according to the first embodiment of the present invention.

Referring to FIG. 1, a first connector 103 is attached to an originating PCB 101 and so integrated as to receive electrical signals to be transmitted to a receiving PCB 102. The electrical signals are converted by the first connector 103 to optical signals which are then transmitted via a bare optical fiber 106 (no ferrule or other type of cap or connector device is present or necessary). The bare optical fiber 106 serves as a conduit for the optical signal and is attached to the first connector 103 with the aid of a retaining mechanism 105 meant to prevent the accidental disconnection of the bare optical fiber 106 from the first connector 103 and second connector 104. The optical signal is further transmitted to the second connector 104, located on the receiving PCB 102. The second connector 104 receives and converts the optical signal to an electrical signal for further processing by components on the receiving PCB 102.

Figures 2, 3:
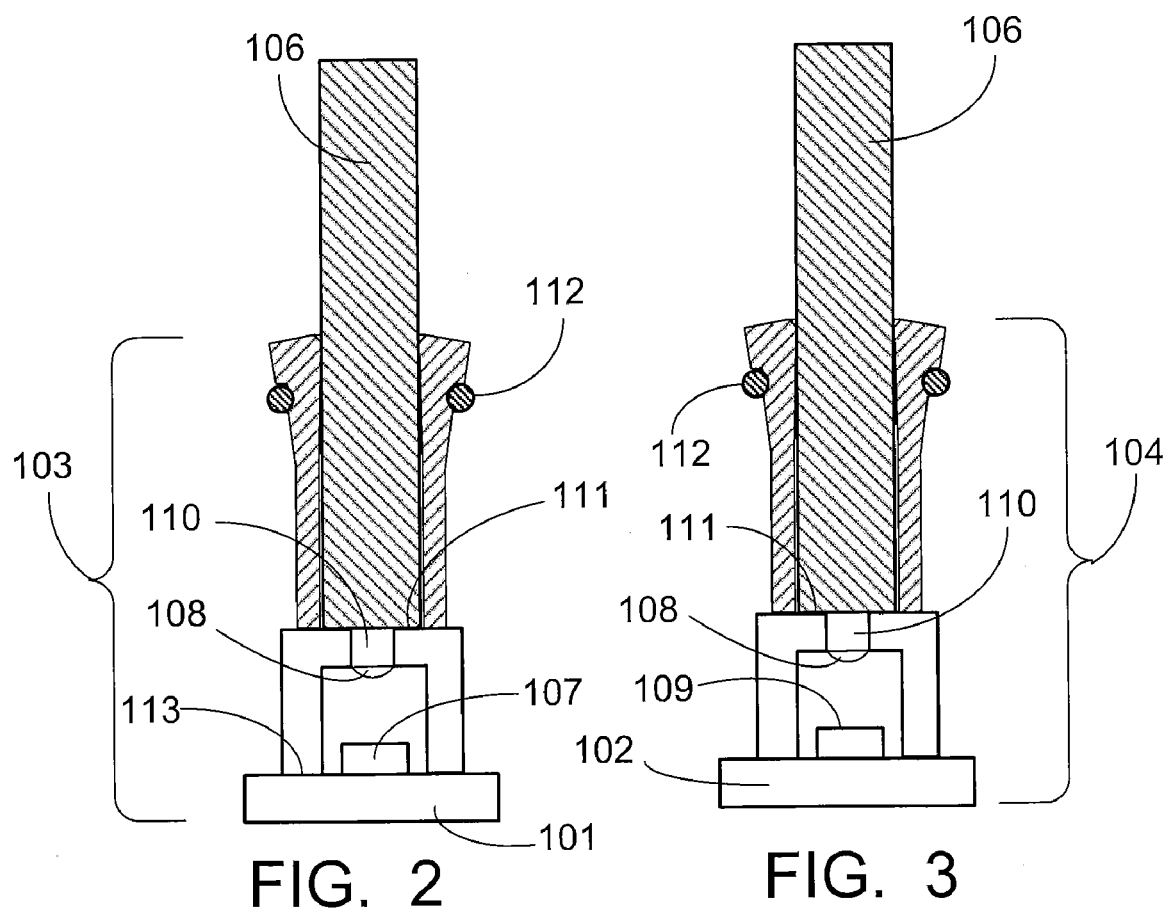
FIGS. 2 and 3 are schematic diagrams showing the micro-connectors according to the first embodiment of the present invention.

Referring to FIG. 2, a first connector 103 includes a transmitter 107 which is used to communicate an optical signal to a bare optical fiber 106. The transmitter 107 can comprise a light source such as a VCSEL and a lens 108, if needed, but it will be understood to those skilled in the art, in view of the disclosure herein, that the transmitter 107 can include a wide variety of devices in any number of configurations. The transmitter 107 is located on a printed circuit board ("PCB") 101 to which it is attached 113 using solder, epoxy, or a variety of additional methods known to those skilled in the art. The light generated from a transmitter 107 then travels away from the PCB 101 and must first traverse a cap 110 used to protect the components of the transmitter 107. This cap 110 may be composed of any material; including glass, plastic, and other durable materials which allow light to traverse and which is known to those skilled in the art. The cap 110 is primarily used to shield the transmitter assembly from damage. Proximate to this cap 110 assembly, the micro-connector assembly illustrated in FIG. 2 includes a detent 111 designed to position the bare optical fiber 106 in optimal alignment to the transmitter 107 module. The bare optical fiber 106 is further held in correct alignment via the use of retaining structures 112 meant to maintain optimal alignment of the bare optical fiber 106 with the transmitter module 107.

Referring to FIG. 3, a second connector 104 is disposed proximate to a receiving PCB 102 which is to receive the signal generated by the transmitter 107 on the first connector 103. The optical signal generated by the transmitter 107 of the first connector 103 is spatially transmitted to the second connector 104 via a bare optical fiber 106. The optical fiber 106 is aligned on the second connector 104 such that similar to the first connector 103, a retaining mechanism 112 is used to help maintain optimal alignment of the optical fiber 106 and the receiver module 109. There also exists a fiber stop channel 111 in the form of the second connector 104 such as to ensure the passive alignment of the bare optical fiber 106. A cap 110 is disposed between the bare optical fiber 106 and the receiving module 109 and is primarily used to shield the receiver module 109 from damage. The cap 110 may be composed of any material; including glass, plastic, or other durable material which allows light to traverse and which is known to those skilled in the art. The receiver module 109 which is used to receive an optical signal spatially transmitted via the bare optical fiber 106, converts the optical signal transmitted via the bare optical fiber 106 to electrical impulses to be carried to components on the PCB 102. It will be understood by those skilled in the art, in view of the disclosure herein, that the receiver 109 can be comprised of a wide variety of devices in any number of configurations.

Information is transferable via these devices depicted in FIGS. 1, 2, and 3 at a rate of at least 10 Gb/s and multiples of 10 Gb/s (100 Gb/s, etc.). Such rates have been unattainable without micro-connections in the past. Such configurations thus accord the industry a heretofore unknown manner of providing improvements in information transfer.

While the invention was described and disclosed in connection with certain preferred embodiments and practices, it is in no way intended to limit the invention to those specific embodiments, rather it is intended to cover equivalent structures structural equivalents and all alternative embodiments and modifications as may be defined by the scope of the appended claims and equivalents thereto.

The invention claimed is:

1. A microconnection between two printed circuit boards, said microconnection including a single bare optical fiber having two ends, wherein one end is engaged to a first microconnection on a first printed circuit board, and wherein the other end is engaged with a second microconnection on a second printed circuit board, wherein each of said microconnections includes a retention means for holding said bare fiber end including a detent, a cap made from a durable material that permits light transmission therethrough, wherein when said bare fiber end is present within said retention means and flush against said detent, said bare fiber end is simultaneously in contact with said cap, and a transmitter and/or receiver module to send and/or receive spatial transmissions from said bare optical fiber through both of said cap and said lens, and wherein said bare fiber end is in direct contact with said cap and said cap is in direct contact with said lens.

2. The micro-connection of claim 1 wherein said bare optical fiber permits information to be transferred between printed circuit boards at a transfer rate of at least 10 Gb/s.

* * * * *